SEMICONDUCTOR DIODE OPERATING CIRCUITS

Filed June 19, 1963 4 Sheets-Sheet 4

United States Patent Office 3,290,516

Patented Dec. 6, 1966

3,290,516

SEMICONDUCTOR DIODE OPERATING CIRCUITS

Jun-ichi Nishizawa, Sendai, Japan, assignor to Semiconductor Research Foundation, Sendai-shi, Japan, a corporation of Japan Filed June 19, 1963, Ser. No. 289,143

Claims priority, application Japan, June 20, 1962, 37/25,914

17 Claims. (Cl. 307—88.5)

My invention relates to semiconductor operating circuits and particularly those performing diode functions such as detection, modulation and multiplication.

The applicability of semiconductor diodes for detection, modulation, multiplication or other diode functions is limited to the band widths determined by the distributed capacitance of the diode itself or of the diode housing or receptacle. Thus the capacitance of a diode, relative to its conductance, should be sufficiently small as not to constitute a shunt for high-frequency signals which are to be detected or modulated. However, a high-frequency diode does in fact exhibit a diffusion capacitance and depletion capacitance, neither of which are easily reduced relative to the diode conductance. In some cases, efforts at such reduction have made the diode liable to burn-out.

It is an object of my invention to obviate the need for decreasing distributed capacitance of diodes in circuits which detect, modulate or perform other functions at high frequencies.

More particularly, it is an object of my invention to compensate for the effect of distributed capacitance in a diode performing detection, modulation and other high-frequency functions.

Also, it is an object of this invention to decrease the effect of distributed capacitance without impairing the detection or other performance of the diode.

According to a feature of my invention, I compensate the effect of the distributed capacitance by connecting the diode in a filter circuit in such a manner that the distributed capacitance performs the function of a capacitor in the filter circuit while at the same time permitting the diode to perform its detection, modulation or other function. I then use the filter circuit in place of the diode.

According to another feature of my invention, I connect a plurality of diodes performing the detection, modulation or multiplication functions in parallel and connect inductive impedances between each of them so as to form a constant K or m-derived filter wherein each diode performs part of the function of the capacitances in the filter and also performs its individual detecting, modulation or other function.

In such a configuration, traveling wave characteristics may appear. However, although many diodes participate in the performance of detection, modulation, multiplication or division or other function, there is substantially no decrease in the input impedance, in fact the input capacitance decreases.

In other words, according to the present invention, the short-circuit effect of the capacitance in the diodes is eliminated because the diodes when forming part of a filter, for example a constant K-type filter, affords adjusting the input impedance of the filter to any desired value and along a broad frequency range so as to eliminate almost entirely the loss caused by the capacitance of the semiconductor device.

Other objects and advantages of the invention will become obvious from the following description when taken in light of the accompanying drawing, wherein.

Figure 6A:
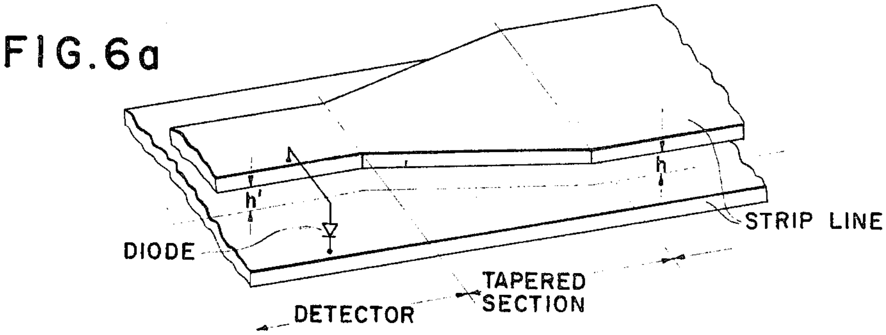
Figure 6B:
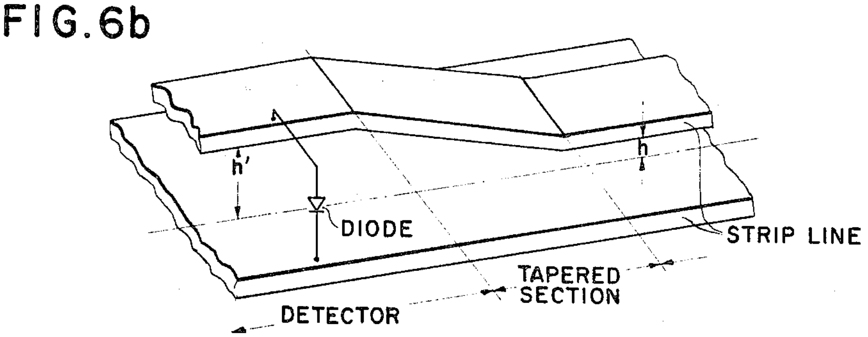
Figure 5A:
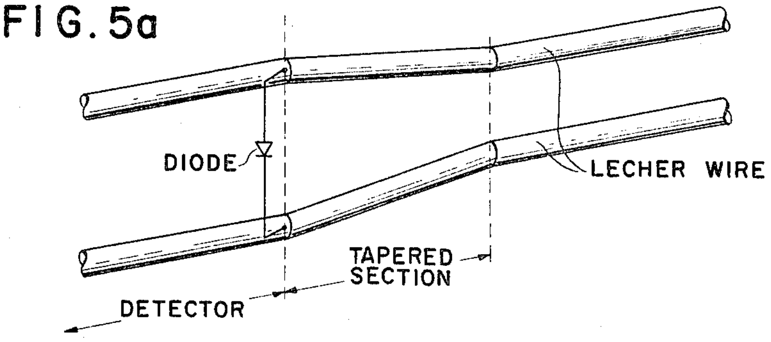
Figure 5B:
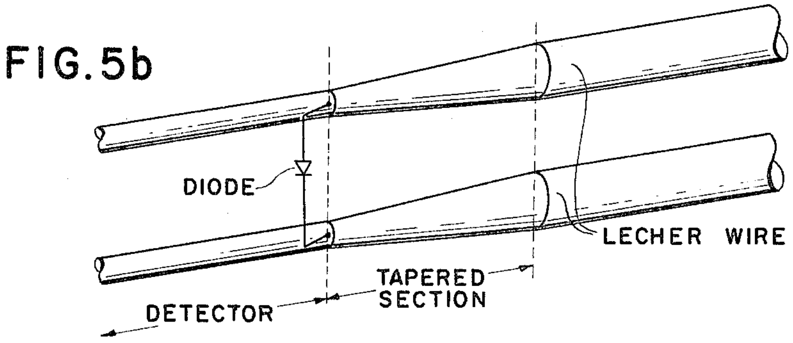
Figure 1B:
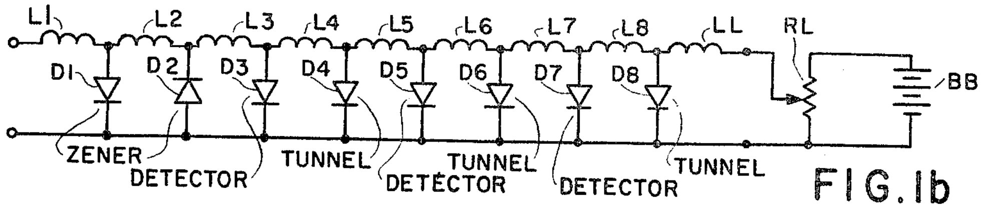
FIG. 1*b* is an equivalent circuit of FIG. 1.
Figure 7A:
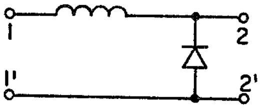
Figure 7B:
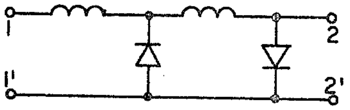
Figure 7C:
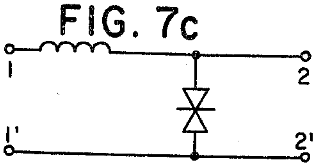
Figure 7D:
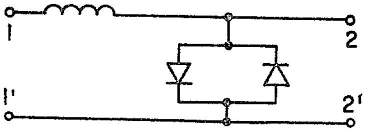
Figure 8A:
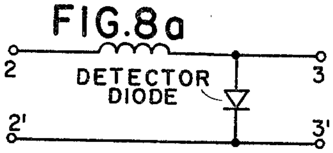
Figure 8B:
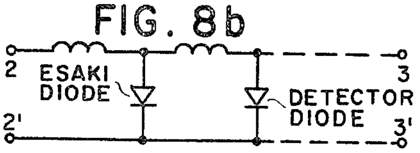
Figure 8C:
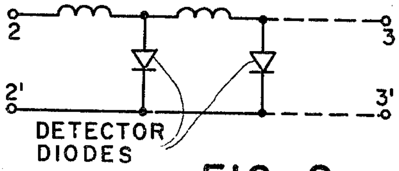
Figure 8D:
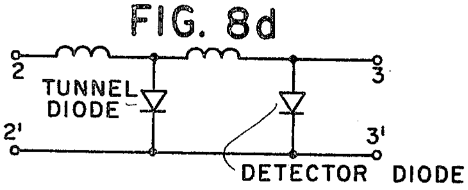
Figure 8E:
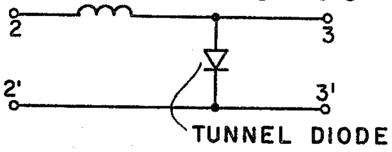
Figure 8F:
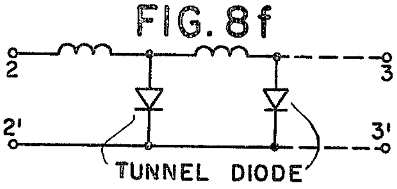
Figure 9A:
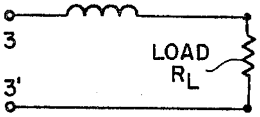
Figure 9B:
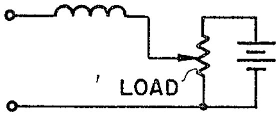
Figure 9D:
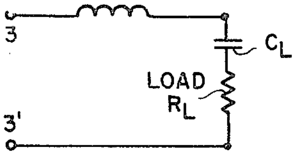
Figure 9C:
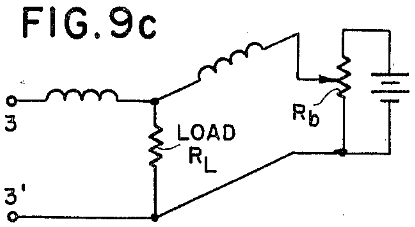
Figure 9E:
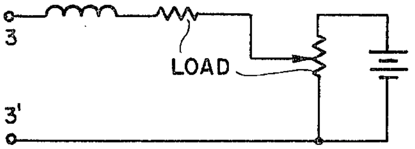
Figure 9F:
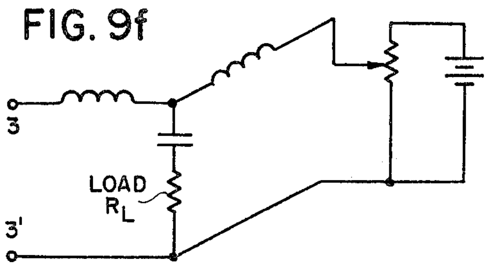
Figure 9I:
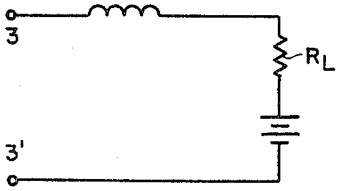
Figure 9G:
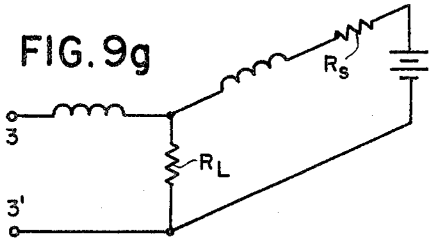
Figure 9H:
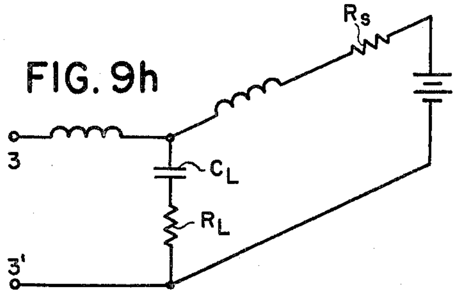
Figure 9J:
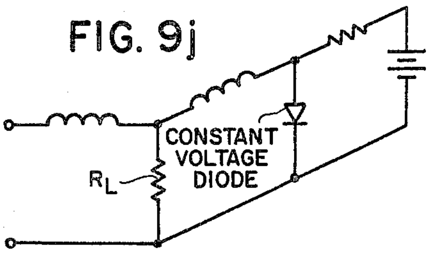

FIGS. 5*a* and 5*b* are perspective views of other embodiments of the invention;

FIGS. 6*a* and 6*b* are perspective views of still other embodiments;

FIGS. 7*a* to 7*d* are schematic diagrams of filter sections, including diodes illustrating the manner in which Zener diodes may be used.

FIGS. 8*a* to 8*f* are schematic diagrams of filter sections using diodes; and

FIGS. 9*a* to 9*j* are schematic diagrams of various terminating means.

Figure 1:
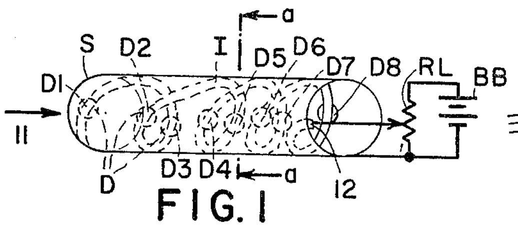
FIG. 1 is a perspective view of a device embodying features of the invention.

In FIG. 1 a conductive sheath S embraces an insulated line I spirally wound within the sheath S and electrically connected to the sheath at spaced points by a plurality of diodes D1 to D8. The latter form shunt connections between the line I and the line S, thereby producing, from the distributed inductance of line I and the stray capacitances of the diodes D1 to D8, a series of filter sections. The input to the line is indicated by 11 and the output by 12. For wideband detection the first diode D1 constitutes a Zener diode poled in one direction and the second diode D2 constitutes a Zener diode poled in the other direction so as to protect the filter thus formed from unusual voltage transients in either direction. The remaining diodes D3 to D8 constitute tunnel or Esaki diodes alternating with detecting diodes. When the first differential conductance coefficient of the tunnel diode is negative the input signal is amplified making possible a power conversion efficiency greater than 100%. The tunnel diode and detecting diodes are chosen and/or biased so that their second differential coefficients have the same sign, thus providing increased detection efficiency. The resulting device can have band widths over 1000 megacycles with a power efficiency over 100%. This is so because the tunnel diode itself detects as well as amplifies. The entire circuit of FIG. 1 is used to perform the functions of the individual diodes.

It is contemplated that the diodes D1 to D8 be replaced by other types of diodes so that the circuit can perform different functions. This will be explained more fully.

Figure 2:
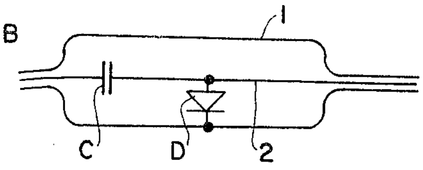
FIG. 2 is a schematic view of another device embodying features of the invention.

In FIG. 2, a voltmeter probe is comprised of a sheath 1 and a line 2 having a capacitor C connected in series therewith. Connecting the line with the sheath is a diode D. According to another feature of the invention the capacitor C is omitted.

Figure 3:
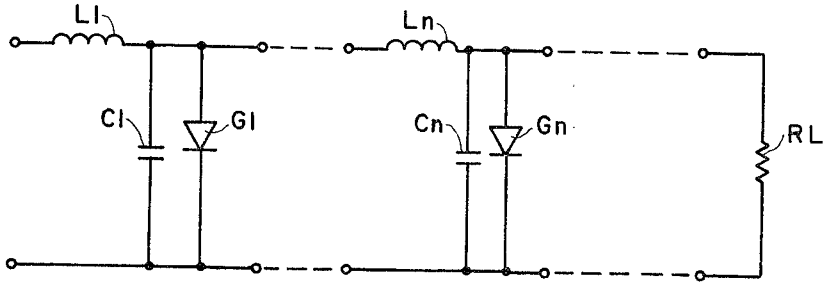
FIG. 3 is a schematic diagram constituting an equivalent circuit showing the principles of the invention.

FIG. 3 is an equivalent circuit showing the principles of the present invention and also representing an actual embodiment. In FIG. 3, a number of series connected components, shown as lumped inductances L1 . . . L*n*, constitute portions of a distributed inductance. Connected thereto at respective intervals, are a plurality of diodes G1 . . . G*n* and capacitors C1 . . . C*n* as shown. Each of the latter represents the total of the distributed effective capacitance of the respective diodes G1 . . . G*n* and the capacitance of a capacitor connected parallel to the individual diodes. The sections L1C1 . . . L*n*C*n* constitute a series of constant-K filter sections which connect to a terminal resistance $R_L$. Accordingly each part of the circuit of the invention when looked at independently constitutes a constant-K filter section although as a whole the structure of the invention is of the distributed type. The characteristic impedance of the filter according to the invention is $$\sqrt{L_1/C_1}=\sqrt{L_2/C_2}= - - - =R_L$$

There is no reflection but adjustment is possible when necessary and the characteristic impedance can be made higher and more constant than the high-frequency impedance $1/jwC$ which prevails when only a diode is used. The filter circuit can perform the signal operation of the diode, for example detection, modulation and amplification and limiting. In particular the amplification can be performed by a negative resistance diode and the limiter function by a diode having a tunnel effect.

The circuits of FIGS. 1 and 3 are suitable for a number of purposes. For example, they can be used for preventing destruction of communication equipment and instruments from excess voltages. In the past, this has been prevented by the use of parallel Zener diodes, opposite direction p-i-p diodes and avalanche diodes. However, these incur large losses because of the distributed capacitance. The effect of the distributed capacitance can be obviated according to the invention by incorporating these devices as one or more of the diodes in the circuits of FIGS. 1 or 3 and using the resulting circuit for protecting equipment from voltage surges. The device then also functions as a filter. Moreover the input loss occasioned by the Zener diodes etc., is eliminated. The limiter and equipment protecting functions are not impaired thereby.

Because, according to the invention, the influence of input impedance is small, the losses and mismatching of impedance in automatic volume control or automatic gain control or amplification which prevail when ordinary diodes are used are avoided. According to the invention detecting diodes are distributed over the sections of a constant-K filter such as shown in FIGS. 1 or 3 and the resulting circuit is used. Now if power is to be transferred from one stage to the next, the energy which is left unabsorbed at the first diode can be absorbed by the second diode and the energy is converted with great efficiency. When the input impedance of the next stage such as a voltmeter is high or high input power is unnecessary, only one diode need be used in the filter. An embodiment of such a device is shown by the voltmeter probe in FIG. 2.

The invention is also applicable to parameter excitation. For this purpose, the circuits of FIGS. 1 to 3 are used. The diodes constitute a variable capacitance in constant-K or $m$-derived type filters. These permit changing of band passes according to the value of the variable capacitance. However, the reflection that may occur when the band pass is changed, for example due to parallel resonance, is entirely eliminated. Also in parameter excitation by known methods, the average capacitance is usually considered as a source of losses. By virtue of the present invention, however, the average loss due to capacitance is essentially eliminated whereas amplification is not impaired. Moreover, reflections are avoided.

Figure 4:
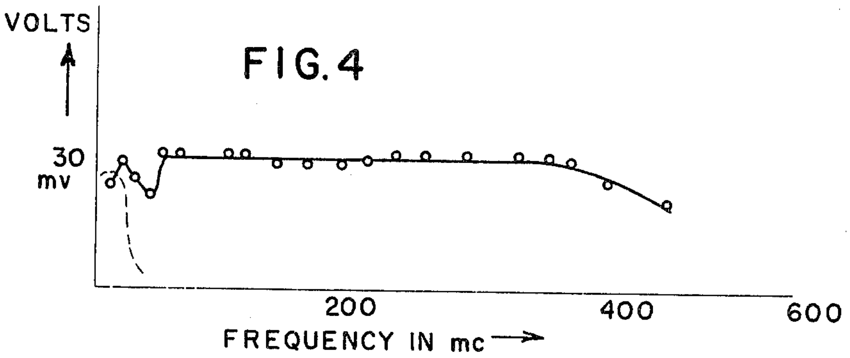
FIG. 4 is a graph illustrating the frequency response of a device according to the invention and the response of a normal diode.
Figure 1A:
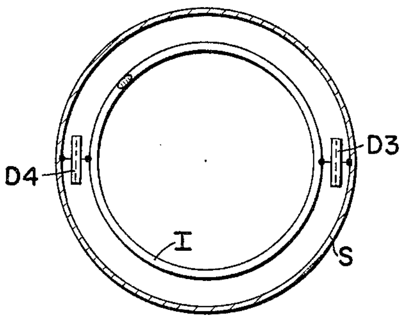
FIG. 1*a* is a sectional view taken along line *a—a* of FIG. 1.

An example of the characteristics of a detector according to FIG. 1 is shown in FIG. 4. The horizontal axis represents the frequency in megacycles and the vertical axis the detected voltage in millivolts. The full line represents the characteristic available by virtue of the present invention and the broken line constitutes the response with an ordinary diode.

It will be abvious that the circuit according to the invention may be used for other purposes. In choosing circuit constants, impedances of capacitances and other circuit elements may be connected in series or in parallel.

In the embodiment of FIG. 1, preferably the members should be matched with one another. That is to say, when the diodes are placed between a strip line and Lecher wire, the parts should be matched. However, if matching is difficult, tapers attached to both ends of the diodes are sufficient to overcome any undesirable effects.

According to a feature of the invention the capacitances of FIG. 3 constitute wholly the effective capacitances of the diodes. In such a case, FIG. 3 may be considered a schematic diagram of the device in FIG. 1. Whether separate capacitors are actually used in addition to the diodes depends upon whether the effective capacitance of the diodes is sufficient to form the desired filter sections.

The invention may also be embodied as in FIG. 2 without the capacitor.

The invention schematically shown in FIG. 3 may also be embodied as two Lecher wires connected to each other by a diode or by a number of diodes at intervals. The Lecher wires then constitute the distributed inductance and part of the capacitance, the diodes performing the remaining capacitor function. The entire filter may be utilized for the purposes mentioned above with regard to FIG. 3 by using particular diodes to perform particular functions.

Such an embodiment is shown in FIGS. *5a* and *5b* wherein tapered sections are used to match one filter section with another. In FIG. *5a* the interconductor distance is changed. In FIG. *5b* the conductor thickness is changed.

The invention may also be practiced in the form of striplines with intermediate diodes as shown in FIGS. *6a* and *6b*. The tapered sections are for matching purposes. In FIG. *6a* the striplines are separated by constant interval, the width of the conductors changing along their length. In FIG. *6b* the interconductor interval is changed.

FIGS. *7a* to *7d* illustrate four filter sections each including Zener diodes which form protective circuits for combination with other filter sections. Such other filter sections are shown in FIGS. *8a* to *8f* composed of distributed inductances with detection and tunnel (Esaki) diodes. These may be combined with each other and with those of FIGS. *7a* to *7b*. In all these cases the capacitors of the filter sections are comprised of the diode capacitances.

FIGS. *9a* to *9j* show various forms of load terminating circuits contemplated by the invention for connection to the filter sections of FIGS. *7a* to *7d* and *8a* to *8f*. The resistor $R_L$ is a load resistance and the battery BB is a biasing battery for the tunnel diodes for example.

FIG. *9a* shows a simple load circuit requiring no bias, there being no Esaki diode, in a detection circuit. FIG. *9b* shows a potentiometer to vary the bias on the load circuit. In FIG. *9c* the load circuit $R_L$ and the bias circuit using a potentiometer $R_b$ are separated from each other. In FIG. *9d*, $R_L$ is used for impedance matching and detected output is obtained from a terminal of $C_L$. In FIG. *9e*, a resistance is inserted in series with inductance in the circuit of *9b*. In FIG. *9f*, a bias circuit is added to the circuit of *9d*. FIG. *9g* uses series resistance $R_s$ instead of a potentiometer for bias of the circuit of the circuit of *9c*. FIG. *9h* uses series resistance $R_s$ instead of a potentiometer for bias of the circuit of *9f*. In FIG. *9i* a bias source is added in series with load $R_L$. In FIG. *9j* bias voltage is obtained by a Zener diode in bias circuit. This can be used in all bias circuits shown.

Reverting to FIG. 1, it can be seen that a biasing battery BB connected across a variable terminating resistance or rheostat RL is connected to the output 12 and the sheath S. FIG. *1a* is a section *a—a* view of the device in FIG. 1 showing the diodes connecting the helical conductor I with the tubular conductor or sheath S. FIG. *1b* is an equivalent circuit diagram of the device in FIG. 1 the lumped inductances L1 . . . L8, LL representing the distributed inductance of line I. The stray capacitances of the diodes D1 . . . D8 forming with inductances L1 to LL filter sections.

While embodiments of the invention have been described in detail it will be obvious to those skilled in the art that the invention may be otherwise practiced.

I claim:

1. A circuit for performing a detector function, comprising a substantially cylindrical conductive housing sheath, a spirally wound wire within said sheath and insulated therefrom, and a plurality of diodes connected between different points of said wire and said sheath at intermittent locations.

2. A circuit comprising a diode having an inherent distributed capacitance and a filter compensating for the distributed capacitance of said diode to provide a broad band frequency characteristic, said filter comprising inductance means and capacitance means including said distributed capacitance.

3. A circuit as claimed in claim 2, wherein said diode is a Zener diode.

4. A circuit as claimed in claim 2, wherein said diode is an avalanche diode.

5. A circuit as claimed in claim 2, wherein said diode is a variable capacitance diode.

6. A circuit as claimed in claim 2, wherein said diode is a tunnel diode.

7. A circuit as claimed in claim 2, wherein said diode comprises a semiconductor tunnel diode.

8. A circuit for performing a function, said circuit comprising a diode for performing said function and having an inherent distributed capacitance and a filter compensating for the distributed capacitance of said diode to provide a broad band frequency characteristic and permitting said diode to perform said function, said filter comprising inductance means and capacitance means including said distributed capacitance.

9. A circuit as claimed in claim 8, wherein said filter has a plurality of series-connected means and shunt-connected means forming a plurality of constant-K filter stages.

10. A circuit as claimed in claim 8, wherein said filter has a plurality of series-connected means and shunt connected means forming a plurality of *m*-derived type filter stages.

11. A circuit as claimed in claim 8, wherein said filter comprises a plurality of detector diodes, Zener diodes, avalanche diodes, variable capacitance diodes and tunnel diodes connected in series and in shunt with each other for performing said function.

12. A circuit for performing a function, said circuit comprising a plurality of diodes for performing said function and each having an inherent distributed capacitance and a plurality of constant-K filter sections connected to each other and compensating for the distributed capacitance of said diode to provide a broad band frequency characteristic, each of said filter sections comprising inductance means and capacitance means including the distributed capacitance of a corresponding one of said diodes.

13. A circuit as claimed in claim 12, wherein said filter sections are connected in cascade with each other and wherein each of said filter sections includes a diode and a capacitor connected in series with each other.

14. A circuit as claimed in claim 12, wherein said filter sections are connected in cascade with each other and wherein each of said filter sections includes a semiconductor diode and a capacitor connected in parallel with each other.

15. A circuit for performing a function, said circuit comprising a plurality of diodes for performing said function and each having an inherent distributed capacitance and a plurality of *m*-derived filter sections connected to each other and compensating for the distributed capacitance of said diode to provide a broad band frequency characteristic, each of said filter sections comprising inductance means and capacitance means including the distributed capacitance of a corresponding one of said diodes.

16. A circuit as claimed in claim 15, wherein said filter sections are connected in cascade with each other and wherein each of said filter sections includes a semiconductor diode and a capacitor connected in series with each other.

17. A circuit as claimed in claim 15, wherein said filter sections are connected in cascade with each other and wherein each of said filter sections includes a semiconductor diode and a capacitor connected in parallel with each other.

References Cited by the Examiner

UNITED STATES PATENTS

| | | | |
|---|---|---|---|
| 2,894,132 | 7/1959 | Skyten | 329—206 |
| 2,994,828 | 8/1961 | Ruthroff | 328—167 |
| 3,079,571 | 2/1963 | Elliott et al. | 334—15 |
| 3,118,117 | 1/1964 | King et al. | 332—30 |
| 3,119,080 | 1/1964 | Watters | 332—30 |
| 3,135,934 | 6/1964 | Schoenike | 307—88.5 |
| 3,147,452 | 9/1964 | Knight | 333—83 |
| 3,158,752 | 11/1964 | Strief | 307—88.5 |
| 3,164,792 | 1/1965 | Georgiev | 307—88.5 |

FOREIGN PATENTS 1,185,404 7/1959 France.

OTHER REFERENCES

Hurley: Junction Transistor Electronics, Copyright 1958 by John Wiley and Sons, Inc., N.Y., pp. 26 and 27.

ARTHUR GAUSS, *Primary Examiner.*

JOHN W. HUCKERT, *Examiner.*

R. H. EPSTEIN, *Assistant Examiner.*